April 24, 1962 K. E. SCHREINER 3,031,621

BROAD BAND FREQUENCY DIVIDER

Filed Nov. 13, 1959 3 Sheets-Sheet 1

INVENTOR
KENNETH E. SCHREINER

BY Curtis Ailes Jr.
ATTORNEY

April 24, 1962 K. E. SCHREINER 3,031,621

BROAD BAND FREQUENCY DIVIDER

Filed Nov. 13, 1959 3 Sheets-Sheet 3

United States Patent Office 3,031,621

Patented Apr. 24, 1962

3,031,621

BROAD BAND FREQUENCY DIVIDER

Kenneth E. Schreiner, Harrington Park, N.J., assignor to International Business Machines Corporation, New York, N.Y., a corporation of New York Filed Nov. 13, 1959, Ser. No. 852,817
7 Claims. (Cl. 328—30)

This invention relates to frequency divider circuits for maintaining a fixed ratio between an input and an output frequency, and more particularly to frequency divider circuits which are capable of accurate operation over a wide range of input frequencies without adjustment of circuit constants.

Prior frequency divider circuits have generally been designed for operation at a fixed input frequency. The fixed operating frequency is often determined by the incorporation of tuned circuits, or by the charge change characteristics of capacitor resistor networks. While such prior frequency dividers may be efficient at their specific design frequencies, there are numerous purposes for which accurate frequency division is required over a broad band of input frequencies. In such instances, the input frequency may vary such that the ratio of the highest to the lowest input frequency is in the order of three to one. Prior frequency dividers have not generally been capable of accurate frequency division under conditions where there is such a wide variation of input frequency, without the necessity for adjustment or substitution of critical circuit components.

Accordingly, it is an object of the present invention to provide an improved frequency divider which is capable of accurate division at a fixed ratio between input and output frequencies over wide ranges of input frequency.

Another object of the invention is to provide such broad band frequency division without adjustment or substitution of circuit components.

Another object of the invention is to provide an improved economical frequency divider which is compensated for input frequency changes.

In carrying out the above objects of this invention in one preferred embodiment thereof a frequency divider is provided employing a capacitor and in which the formation of each alternating output voltage wave is determined by a combination of repeated cycles of charge change voltage on the capacitor, and an alternating input voltage. An integration circuit is connected for response to one of the alternating voltages and operable to derive a direct current voltage level which is a function of the frequency thereof, the integration circuit being connected to decrease the duration of the charge change voltage cycle as the frequency increases.

Further objects and advantages of the invention will be apparent from the following specification and the accompanying drawings which are briefly described as follows.

Figure 6:
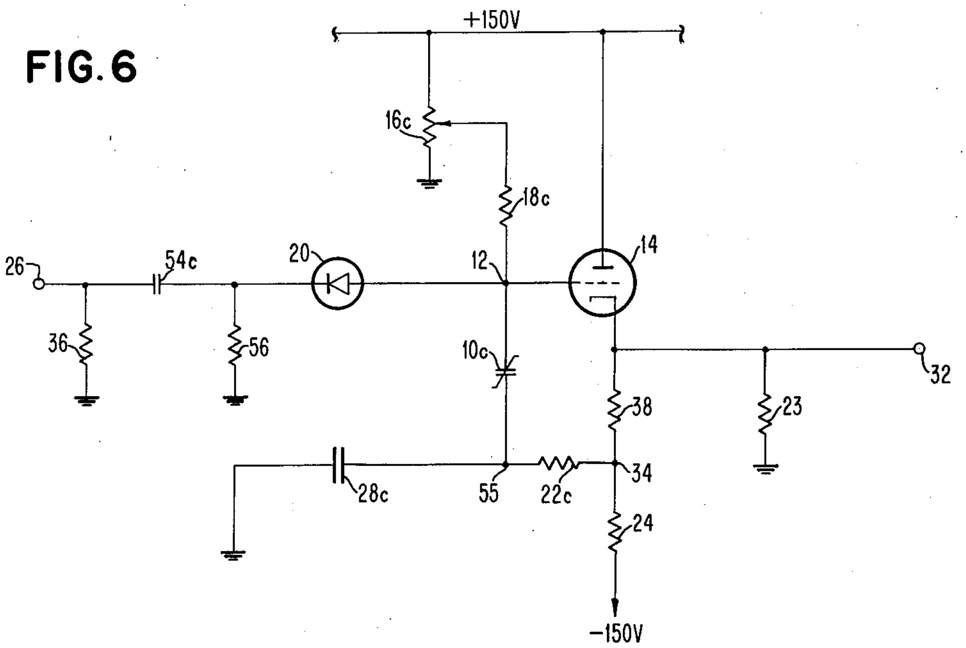

And FIGURE 6 is a schematic circuit diagram of an alternative embodiment of the invention in which a voltage variable capacitor is employed.

Figures 1, 2:
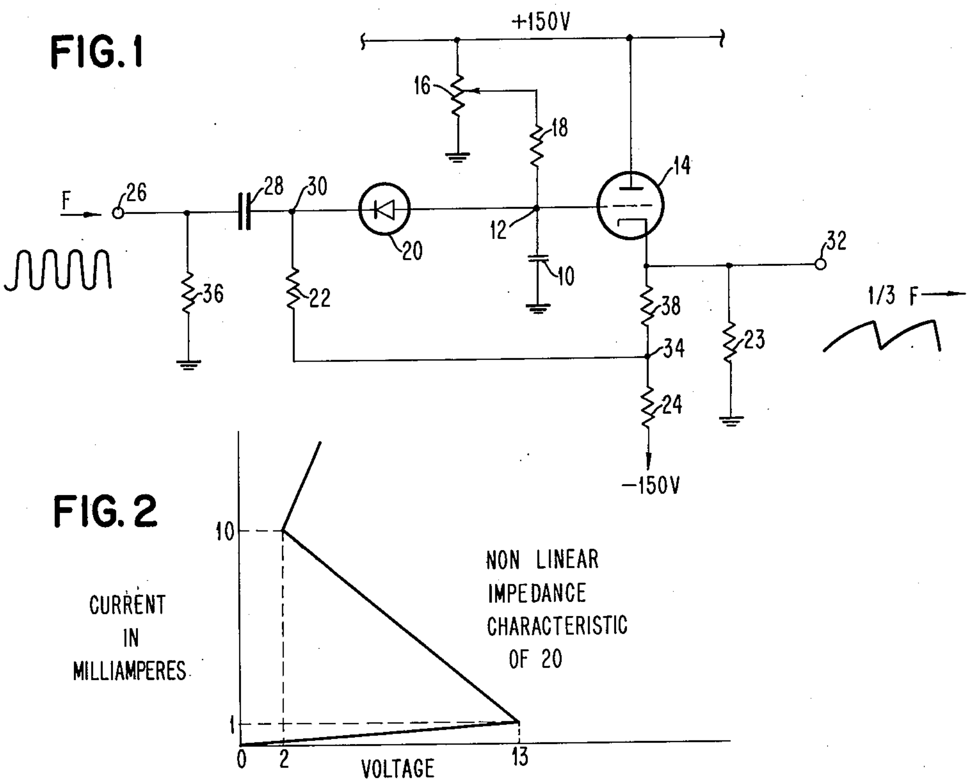
FIGURE 1 is a schematic circuit diagram of a preferred embodiment of a single stage frequency divider in accordance with this invention.
FIGURE 2 is an idealized impedance characteristic curve of a preferred non-linear impedance employed in the circuit of FIGURE 1.

Referring more particularly to FIGURE 1, the charge condition of capacitor 10, as indicated at point 12, determines the conductive condition of electron discharge device 14 through the control grid connection thereto. A charging circuit for capacitor 10 is provided through potentiometer 16 and resistor 18. And a discharge path for capacitor 10 having a much lower impedance is provided through non-linear impedance 20, resistor 22 and the cathode circuit of device 14 including resistors 23, 24 and 38.

In the absence of an alternating input voltage signal, the discharge circuit path including non-linear impedance 20 is not sufficiently conductive to discharge capacitor 10 at a rate faster than the rate of charge, and the point 12 is maintained at a voltage level resulting in a conductive condition of device 14. When an alternating input voltage signal is applied at input terminal 26 it is transmitted through capacitor 28 to point 30 between impedance 20 and resistor 22. And upon the occurrence of a negative going loop of the input voltage, a sufficient voltage drop is provided across the non-linear impedance 20 between the points 12 and 30 to force the non-linear impedance 20 into a state of high conduction. This causes a rapid discharge of the capacitor 10 and a resultant decrease in the conduction of valve 14 with a consequent decrease in the output voltage appearing at output terminal 32. However, after this rapid discharge of capacitor 10, the voltage across non-linear impedance 20 is reduced to such an extent that it again achieves its low conduction state, and capacitor 10 is then recharged at a rate determined by the effective combined resistance values of resistor 18 and potentiometer 16 in relation to the capacitance of capacitor 10.

After a predetermined number of cycles of the input voltage have passed, the charge is reestablished upon capacitor 10 sufficiently so that the addition of another negative going loop of the input voltage will again "trigger" the non-linear impedance to a high conductive state to provide another negative going excursion of the output voltage wave. In this manner, with a repetitive input signal as indicated at terminal 26, a repetitive output signal is provided as indicated at output terminal 32. By proper selection and adjustment of the values of the circuit constants, a desired reduction in frequency may thus be accomplished. As indicated in FIGURE 1, this frequency division can be, for instance, in a ratio of three to one so that the output frequency is one third of the input frequency.

Assuming that input voltage amplitude does not vary appreciably, it will be apparent from the above explanation that the charge recovery period of capacitor 10, as determined by the RC relationship of the resistor 18 and capacitor 10, must be related to the period of the input frequency and the desired frequency division factor. For instance, for a division by three, the period during which capacitor 10 is recharged between trigger actions should preferably be approximately equal to three times the period for one complete cycle of the input voltage. It will be appreciated therefore that if the input frequency changes, with the system as thus far described, the recharging rate for the capacitor 10 will no longer be precisely appropriate for maintaining a desired fixed division factor.

It is an important feature of this invention that compensation for this mismatch in operating periods is provided in response to variation of input frequency. This is accomplished through a voltage stored in capacitor 28. Capacitor 28 is much larger in capacity than capacitor 10 and has a longer charge period. The average voltage level of point 30 is therefore essentially determined by the charge condition upon capacitor 28. Because of the connection through resistor 22 to the cathode follower resistor 24 at point 34, it is apparent that the portion of the output voltage which appears as a voltage drop across resistor 24 controls the charge upon capacitor 28 and the average potential at point 30.

From the above explanation, it is apparent that the output which appears at output terminal 32, as well as the portion which appears at point 34 in the circuit is essentially a reproduction of the potential at point 12. This is a saw-tooth wave in which the repeated rising portions are reproductions of the RC capacitor charging curve of capacitor 10. For high input frequencies, a short part of the RC curve contributes to this portion of the output voltage. But at low frequencies of the input signal a longer part of the RC curve is used. Because of the asymptotic nature of the RC curve, the average D.C. level of the output voltage at higher frequencies of operation differs from the average D.C. level at lower frequencies of operation (as related to the negative peak of the output signal). At lower frequencies, the D.C. level is higher, and at higher frequencies the D.C. level is lower. This is true because at the lower frequencies, the asymptotic rising portion of the saw-tooth output has a greater upward facing convexity. In other words, it is "fatter." This frequency variation in the D.C. component of the output is transmitted from the point 34 back to the point 30, and because of the regenerative nature of this D.C. feed back connection the variation in D.C. level which is related to frequency of operation grows in amplitude. The capacitor 28 and the D.C. feedback connections thereto may be characterized as forming an integration circuit for measuring frequency when considered in combination with the rest of the system.

Accordingly, the higher the frequency of operation of the circuit, the lower is the average D.C. level of potential at point 30. Since the timing of the operation of the circuit is dependent upon the "triggering" of the device 20 at a given voltage drop across the device, a lowering of the average D.C. level of potential at point 30 provides an earlier triggering action for each output cycle in respect to the stage of advancement on the RC charge curve of capacitor 10. Accordingly, this provides a shortening of the effective portion of the recharging cycle of capacitor 10 and thus provides the necessary compensation for operation at a higher frequency. An elaboration upon the operation of the circuit of FIGURE 1 is given below with reference to FIGURES 2 and 3.

A resistor 36 at the input terminal 26 is for the purpose of determining the input impedance which ties capacitor 28 to ground. It will be understood that the internal impedance of the voltage source supplying the input signal at terminal 26 may be adequate for this purpose and no actual resistor 36 may be necessary. Resistor 36 may then be considered to simply represent the internal impedance of the signal source.

In FIG. 2 there is illustrated a preferred impedance characteristic for the non-linear impedance element 20 in terms of a voltage-current curve. It will be seen from this curve that from a zero voltage value up to a triggering voltage of about thirteen volts, the device is in a low conduction state in which the current is limited to about one milliampere or less. However, at the triggering voltage of about thirteen volts, the negative resistance characteristic portion of the curve becomes effective and the current immediately rises to ten milliamperes or more at a voltage drop which may be as low as two volts. When the voltage then drops below two volts, which is the minimum voltage in the high conductive state, the device again reverts to the low conductive state at a current below one milliampere. The preferred non-linear impedance device for the present invention, having characteristics of the general nature as illustrated in FIG. 2, is a so-called non-linear diode. This term, as used here, is intended to refer to semi-conductor diodes which are sometimes referred to as "PNPN" diodes or "negative-resistance," or "positive-gap," or "Reeves" diodes. Diode devices having these characteristics are presently available from a number of sources on a commercial basis. This type of non-linear diode is generally referred to as possessing the "Z" voltage-current characteristic. Various semi-conductor materials such as germanium and silicon may be employed in their construction.

While a diode is preferred as the non-linear impedance element, it will be apparent that other non-linear impedance elements such as gaseous glow discharge tubes may be employed for this purpose so long as they provide an appropriate voltage-current impedance characteristic which is generally of the nature illustrated in FIGURE 2. It is important in the selection of such a non-linear impedance element that the triggering potential characteristic must remain at a reasonably consistent value in order to assure accurate operation of the system.

Figure 3:
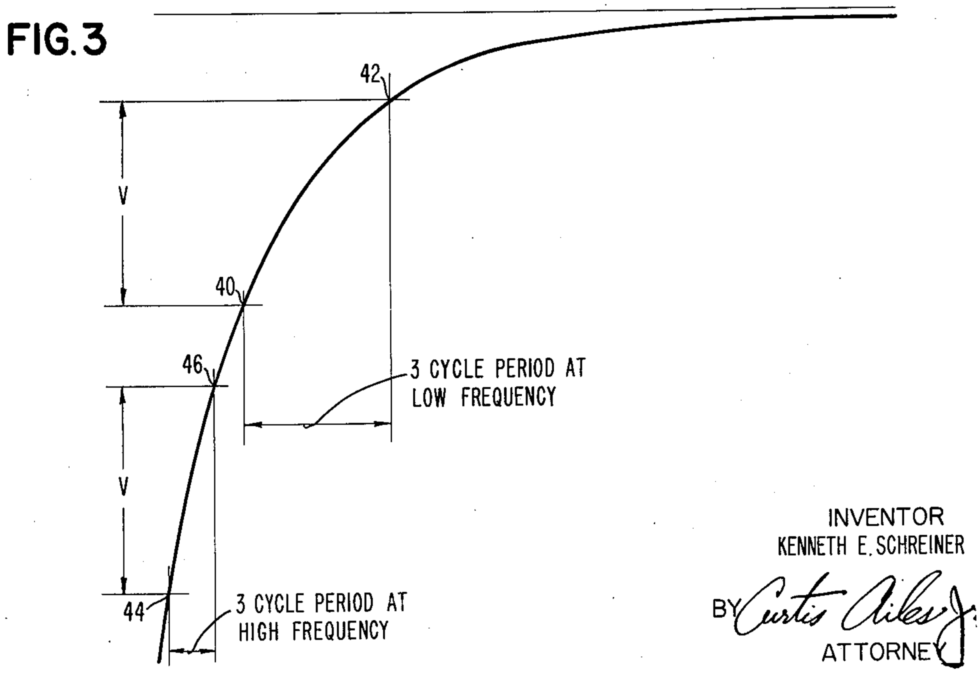
FIGURE 3 is an idealized showing of the charge curve of capacitor 10 with different operating frequency regions indicated.

In FIGURE 3 there is shown an idealized resistance capacitance charge curve for capacitor 10 in the circuit of FIGURE 1. As explained briefly above, because of the varying D.C. bias supplied to the point 30 through the feed back connection including resistor 22, different portions of the RC curve for the capacitor 10 are operative in controlling the operation of the circuit through the valve 14 when the input frequency is varied. For instance, near the lower end of the frequency range of operation of the circuit, the average D.C. level of point 30 is fairly high, and all of the switching occurs at a higher level of average charge on capacitor 10. Accordingly, a higher portion of the resistor capacitor charge curve for capacitor 10 is employed for such switching as illustrated for instance by the points marked 40 and 42 on the curve of FIGURE 3. At higher frequencies of operation, the average D.C. level at point 30 is reduced and the entire operation occurs at a lower average charge value upon capacitor 10, employing a lower portion of the RC curve as illustrated between points 44 and 46 in FIGURE 3. It is apparent from this figure that with a switching voltage V which is essentially a constant value as indicated by the vertical dimensions between 40 and 42 or between 44 and 46, a relatively long three-cycle period is provided to match the low frequency as indicated by the horizontal spacing between points 40 and 42, as compared to a comparatively short three-cycle period for the high frequency as indicated by the horizontal spacing between 44 and 46. Thus, portions of the RC curve having different average slope values are employed at the different frequencies to provide frequency compensation. It may be said therefore that the capacitor charges more rapidly to the triggering level during operation at the higher frequencies.

Figure 4:
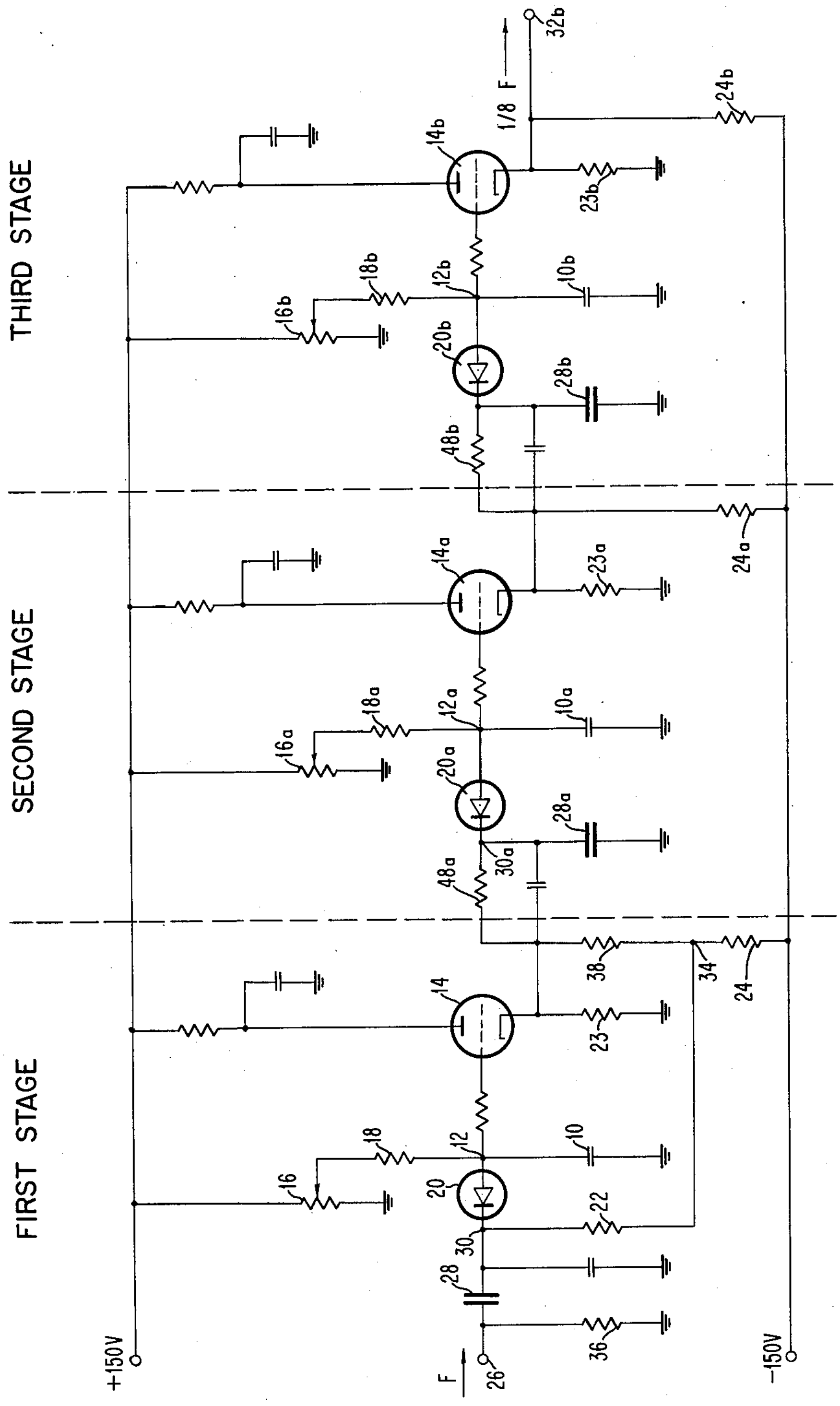
FIGURE 4 is a schematic circuit diagram of a refined three stage version of the divider circuit of FIGURE 1.

FIGURE 4 is a schematic circuit diagram of a three stage version of the divider circuit of FIGURE 1 in which certain refinements have been added. The circuit constants of this circuit can be so chosen for instance that each stage is capable of accomplishing a division by a factor of two so that the total combination accomplishes division by a factor of 8. Each of the stages is similar in construction to the circuit shown in FIGURE 1. However, the major exception is that in the second and third stages, the integration D.C. voltage level for the purpose of accomplishing frequency compensation is derived from the first stage rather than generated by a new feedback connection. The frequency compensating D.C. bias voltage is carried into the second stage, including valve *14a*, by a signal coupling resistor *48a* so as to control the D.C. voltage level on integration voltage storage capacitor *28a*. In a similar manner, a D.C. coupling is provided between the second stage and the third stage by resistor *48b* to control the average voltage level on capacitor *28b*. Thus, the D.C. level generated in the first stage is transmitted through the second and third stages, providing frequency compensation in all three stages.

It is to be appreciated therefore that the frequency compensation provided in the second and third stages is fully in accordance with the principles described above in connection with FIGURE 1. But there is a difference in that the D.C. integration signal is not the result of feed back within these individual stages, but the result of a D.C. integration signal which is fed in at the inputs of these respective stages, having been generated in an earlier portion of the system. Also, in the second and third stages of FIGURE 4, the voltage level storage capacitors 28*a* and 28*b* are connected directly to ground instead of in series with the input path. This is a minor modification as it will be apparent that the circuit of FIGURE 1 could be so modified to provide the D.C. voltage level capacitor 28 in parallel with the input instead of in series with it.

Figure 5:
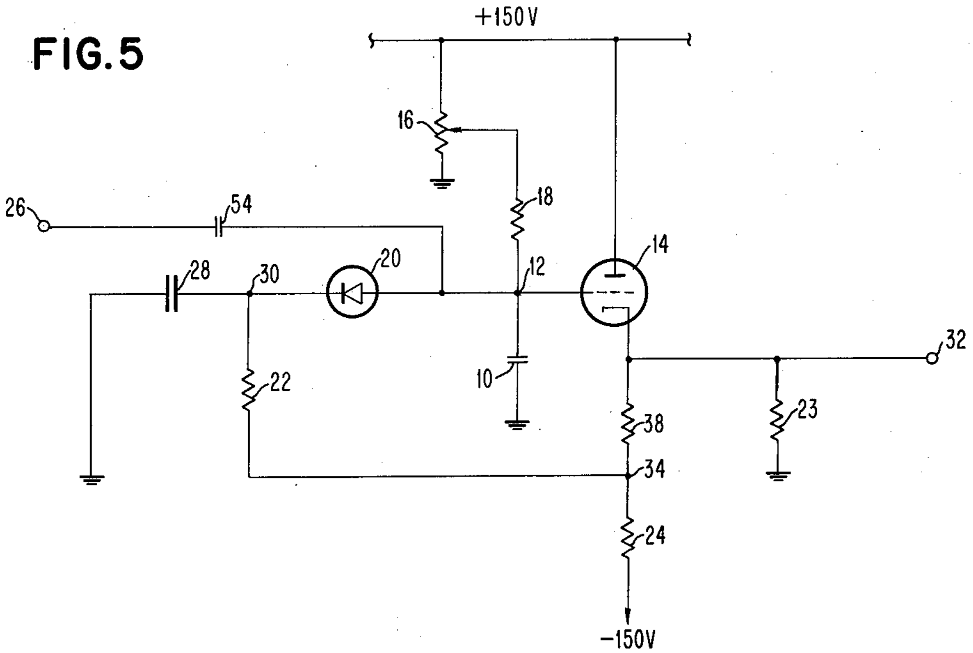
FIGURE 5 is a diagram of a modification of the circuit of FIGURE 1.

The circuit of FIGURE 1 can be modified in various ways in addition to those suggested by the circuit of FIGURE 4. For instance, in FIGURE 5 it is shown that the input signal from the input terminal 26 can be applied directly to point 12 rather than to capacitor 28. For this purpose, a separate coupling capacitor 54 must be added.

In FIGURE 6 there is shown another modification of the circuit of FIGURE 1 in which a voltage variable capacitor 10*c* is employed. In this embodiment, the frequency measurement manifested by the D.C. potential level which is stored in the capacitor 28*c* is applied directly to the lower terminal 55 of the voltage variable capacitor 10*c*. Terminal 55 is consistently maintained at an average D.C. level below the D.C. level of point 12. Rather than changing the slope region of the RC curve employed to obtain the frequency compensation, the RC curve itself is changed by changing the capacity of 10*c* in response to the voltage applied thereto. The input signal is fed through a coupling capacitor 54*c* and a capacitor discharge circuit through device 20 is provided by resistor 56. The voltage variable capacitor 10*c* is a semiconductor silicon P-N junction device such as is available commercially from several sources including Pacific Semiconductors, Inc. of Culver City, California. Although shown as a capacitor in the drawing, this device is essentially a semiconductor diode. It will be understood that other voltage variable devices may be employed.

It will be apparent that the system of FIGURE 1 may also be modified by substituting an inductance for resistor 18, and a resistor for capacitor 10. The inductance would then perform the energy storage function previously filled by capacitor 10. Damping resistors may be necessary in such a modification to prevent oscillations due to energy transfers between the inductance at position 18 and capacities of the system such as capacitance 28.

It is apparent from the few alternative embodiments which are illustrated, that many modifications of this invention are possible without departing from the true spirit and valid scope of the invention.

It has been found that with the embodiment of the system of FIGURE 1, employing circuit constants appropriate for division by a factor of two, accurate frequency division may be obtained for input frequencies which vary over a range as great as three to one. However, when designed with appropriate circuit constants for division by factors greater than two, the range of variation of input frequencies over which accurate division can be obtained is reduced.

Also, because of the voltage responsive operation of the circuits described above, the accuracy of frequency division operation may be somewhat subject to variations in amplitude of the alternating input signal voltage. These difficulties can be compensated for by the employment of preamplifiers having automatic volume control features if the raw unknown signal is expected to vary substantially in amplitude. However, because of the fact that the present invention provides excellent compensation for the variation in frequency, it will be apparent that the systems of the present invention are not as sensitive to input voltage amplitude variations as they otherwise would be. Accordingly, it is an important feature of this invention that there is provided a frequency divider in which input voltage amplitude variations create a minimum of difficulty.

While the invention has been particularly shown and described with reference to preferred embodiments thereof, it will be understood by those skilled in the art that various changes in form and details may be made therein without departing from the spirit and scope of the invention.

What is claimed is:

1. A broad band frequency divider comprising a capacitor, a charging circuit of limited capacity connected to said capacitor, a discharge circuit including a variable impedance element having high and low conductive states connected to discharge said capacitor when in the high conductive state, a signal path for adding an alternating input frequency voltage to the capacitor charge voltage to control the repeated initiation of the high conductive state to generate an output voltage frequency which is a fixed fraction of input frequency, said discharge circuit including an integrator having a charge storage capacitor and operable in response to one of said frequencies to provide an average D.C. voltage level of operation of said first named capacitor which is an inverse function of operating frequency, said average D.C. voltage level of operation controlling the operating region on the capacitor charge change curve of said first named capacitor to thereby provide frequency compensation.

2. A frequency divider comprising a current carrying device controlled by a control electrode, a capacitor connected to said control electrode, a charging circuit of limited capacity connected to said capacitor, a discharge circuit including a variable impedance element having high and low conductive states connected to discharge said capacitor when in the high conductive state, a signal path for adding an alternating input frequency voltage to the capacitor charge voltage to control the repeated initiation of the high conductive state to generate an output frequency which is a fixed fraction of the input frequency, said discharge circuit including an integrator having a D.C. feed back connection from the output of said device to provide an average D.C. voltage level which is an inverse function of output frequency, and connections applying said D.C. voltage level to control the operating region on the capacitor charge change curve to provide frequency compensation to maintain a fixed ratio between the input and output frequencies despite wide fluctuations in input frequency.

3. A broad band frequency divider comprising a normally conductive current carrying device controllable by means of a control electrode, a capacitor connected to the control electrode for control of said device in response to the charge condition of said capacitor, a charging circuit of restricted current carrying capacity connected to charge said capacitor, a discharge circuit including a variable impedance element having high and low conductive states connected to discharge said capacitor when in the high conductive state, a signal path for adding an alternating input frequency voltage to the capacitor charge voltage to repetitively control the initiation of the high conductive state to generate an output voltage frequency which is a fraction of the input frequency, said discharge circuit including an integrator having a D.C. feed back connection from the output of said device and a charge storage capacitor connected thereto to provide an average D.C. voltage level of operation of said first named capacitor which is an inverse function of output frequency, said average D.C. voltage level of operation controlling the operating region on the capacitor charge change curve of said first named capacitor to provide frequency compensation to maintain a fixed ratio between the input and output frequencies despite wide fluctuations in input frequency.

4. A broad band frequency divider comprising a voltage variable capacitor, a variable impedance element connected thereto and operable in response to a combination of a charge condition of said capacitor and an alternating input voltage to switch to a high conductive condition, a capacitor discharge circuit connected to said element to discharge said capacitor when said element is in the high conductive condition, said element being switched to a low conductive condition upon discharge of said capacitor, a resistive charging circuit connected to said capaitor and operative when said element is in the low conductive condition to recharge said capacitor, apparatus for transmitting the repeated charge and discharge voltage condition of said capacitor to provide an alternating output voltage frequency which is an integral fraction of the input voltage frequency, an integration circuit connected for response to one of said alternating voltages and operable to derive a direct current voltage level which is an inverse function of the frequency thereof, said integration circuit being connected to said capacitor to control the capacitance thereof to decrease the duration of said capacitor charge voltage cycle as said frequency increases.

5. A broad band frequency divider comprising a normally conductive grid controlled electron discharge device, a capacitor connected to the control grid for control of said device in response to the charge condition of said capacitor, a charging circuit of restricted current carrying capacity connected to charge said capacitor, a discharge circuit including a non-linear negative impedance element having high and low conductive states connected to discharge said capacitor when said negative impedance element is in a high conductive state, a signal path for applying an alternating input frequency voltage to said negative impedance element and operative in conjunction with the capacitor charge voltage to repetitively control the initiation of the high conductive state, an impedance connected in the cathode circuit of said electron discharge device to provide a cathode follower output, an integrator connected to receive said cathode follower output arranged to provide a D.C. voltage level which is a function of output frequency, and connections applying said last named D.C. voltage level to said negative impedance element to compensate the control of the initiation of the high conductive state thereof to maintain a fixed ratio between the input and output frequencies.

6. A broad band frequency divider comprising a capacitor, a non-linear impedance element connected thereto and operable in response to a combination of a charged condition of said capacitor and an alternating input voltage to switch to a high conductive condition, a capacitor discharge circuit connected to said non-linear element to discharge said capacitor when said element is in the high conductive condition, said non-linear element being switched to a low conductive condition upon discharge of said capacitor, a resistive charging circuit connected to said capacitor and operative when said element is in the low conductive condition to recharge said capacitor, apparatus for transmitting the repeated charge and discharge voltage condition of said capacitor to provide an alternating output voltage frequency which is an integral fraction of the input voltage frequency, an integration circuit connected for response to one of said alternating voltages and operable to derive a direct current voltage level which is an inverse function of the frequency thereof, said integration circuit being connected to said element to decrease the duration of said capacitor charge voltage cycle as said frequency increases.

7. A broad band frequency divider comprising a normally conductive current carrying device controllable by means of a control electrode, a capacitor connected to the control electrode for control of said device in response to the charge condition of said capacitor, a charging circuit of restricted current carrying capacity connected to charge said capacitor, a discharge circuit including a non-linear negative impedance element having high and low conductive states connected to discharge said capacitor when in the high conductive state, a signal path for applying an alternating input frequency voltage to said negative impedance element and operative in conjunction with the capacitor charge voltage to repetitively control the initiation of the high conductive state to generate an output voltage frequency which is a fraction of the input frequency, an integrator including a D.C. feed back connection from the output of said device to provide an average D.C. voltage level which is a function of output frequency, and connections supplying said D.C. voltage level to said negative impedance element to control the operating region on the capacitor charge change curve to provide frequency compensation to maintain a fixed ratio between the input and output frequencies despite wide fluctuations in input frequency.

References Cited in the file of this patent

UNITED STATES PATENTS

| | | |
|---|---|---|
| 2,111,386 | Buchmann et al. | Mar. 15, 1938 |
| 2,221,452 | Lewis | Nov. 12, 1940 |
| 2,221,665 | Wilson | Nov. 12, 1940 |
| 2,562,889 | Buckbee | Aug. 7, 1951 |
| 2,665,379 | Hadden | Jan. 5, 1954 |
| 2,686,263 | Konick | Aug. 10, 1954 |
| 2,962,663 | Hileman | Nov. 29, 1960 |